United States Patent [19]

Kim et al.

[11] Patent Number: 5,309,101

[45] Date of Patent: May 3, 1994

[54] MAGNETIC RESONANCE IMAGING IN AN INHOMOGENEOUS MAGNETIC FIELD

[75] Inventors: Jae K. Kim; Donald B. Plewes; Ross M. Henkelman, all of Toronto, Canada

[73] Assignee: General Electric Company, Milwaukee, Wis.

[21] Appl. No.: 1,967

[22] Filed: Jan. 8, 1993

[51] Int. Cl.$^5$ ............................................. G01R 33/20
[52] U.S. Cl. .................................................. 324/309
[58] Field of Search ............... 324/300, 307, 309, 310, 324/311, 312, 313, 314, 318, 322; 128/653.2

[56] References Cited

U.S. PATENT DOCUMENTS

| | | | |
|---|---|---|---|
| 4,857,843 | 8/1989 | Macovski | 324/307 |
| 4,876,508 | 10/1989 | Taylor | 324/309 |
| 5,070,876 | 12/1991 | Wright | 128/653 |
| 5,229,722 | 7/1993 | Rommel et al. | 324/307 |

OTHER PUBLICATIONS

Lai C. M., J. Phys. E. Sci. Instrum. 15:1093–1100, 1982 (no month).
Feig E., Greenleaf, Perlin M. Phys. Med. Biol. 31:1091, 1986 (no month).
Wong T. S., Rosenfeld D. IEEE Trans. on Medical Imaging, MI-6:148–155, 1987 (no month).
Bendal P. IEEE Trans. Med. Imaging, MI-4:114–119, 1985 (no month).
Miller J., Garroway A. N. J. Magn. Reson. 67:575–579, 1986 (no month).
Henning J., Freidburg H. Magn. Reson. Imaging, 6:391, 1988 (no month).
Melki P. S., Mulkern R. V., Listerud J., et al. 10th SMRM, p. 219, 1991 (no month).
Scott G. S., Joy M. L. G., Armstrong R. L., Henkelman R. M. SMRM, 1991 (no month).
Graumann R., Opelt A., Stetter E. Magn. Reson. Med., 3:707, 1986 (no month).
Hennel F. Magn. Reson. Med., 26:116–121, 1992 (no month).

Primary Examiner—Michael J. Tokar
Attorney, Agent, or Firm—James O. Skarsten; Robert R. Schroeder

[57] ABSTRACT

A method for MR imaging in an inhomogeneous magnetic field substantially without inhomogeneity induced artifacts is disclosed. The method includes acquiring more than one line of K-space per pulse sequence. The K-space data is acquired in partial line segments. The method allows shorter imaging times and higher image quality than conventional imaging methods for inhomogeneous fields.

21 Claims, 2 Drawing Sheets

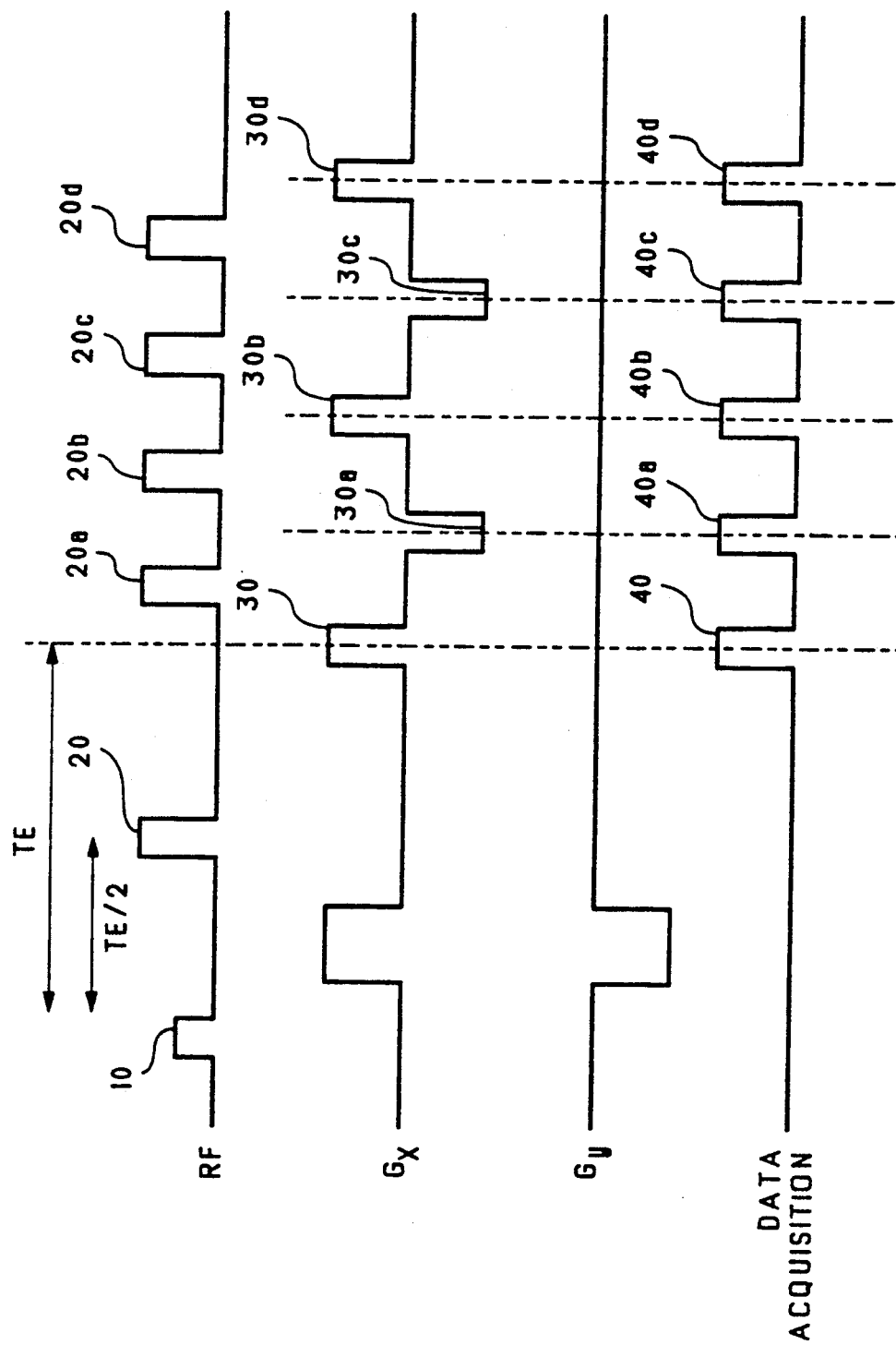
FIG.1.A.

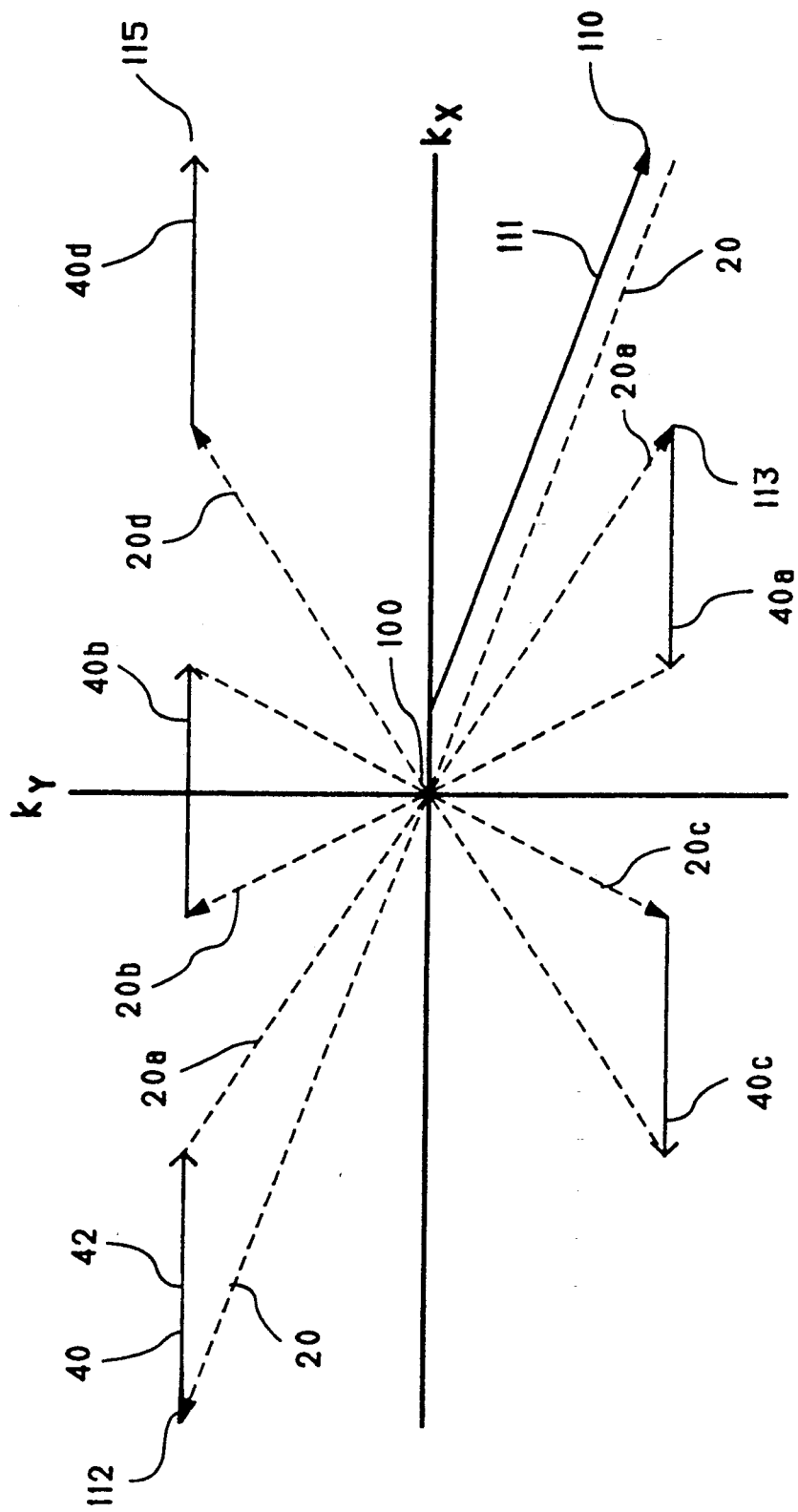
FIG.1.B.

MAGNETIC RESONANCE IMAGING IN AN INHOMOGENEOUS MAGNETIC FIELD

FIELD OF THE INVENTION

The present invention relates to magnetic resonance imaging methods and systems. In particular, the present invention relates to a method for MR imaging in an inhomogeneous magnetic field.

BACKGROUND OF THE INVENTION

Magnetic resonance imagers in use today are large and expensive. The most expensive component of an MR imager is the arrangement of large, solenoidal super conducting magnets. High quality magnets having high magnetic field strength of about 2 Tesla and magnetic field homogeneity of 0.1 to 1.0 parts per million are essential for producing high quality images. Because of the cost of imagers, magnetic resonance imaging is presently only available for critical clinical cases.

In the industry, emphasis has been placed on the development of less expensive imagers containing lower quality magnets to allow wider application of MR imaging. Lower quality magnets generally have low magnetic field strengths of up to about 1.5 Tesla with magnetic field inhomogeneity of 70 to 100 parts per million. Homogeneity of this order presents problems with image artifacts. A need exists for a reliable and safe method of clinical imaging in inhomogeneous magnetic fields.

An imaging system having slight magnetic field inhomogeneity produces images with spatial distortion and signal to noise problems. A distorted image can be corrected by remapping the misregistered spins back into their true positions. The remapping technique is limited to weakly inhomogeneous fields and requires that the field distortions are known. In addition, remapping involves stretching the image, resulting in a nonuniform signal to noise.

As field inhomogeneity increases, more serious imaging problems arise such as complete signal cancellation by incoherent dephasing. As is known in the art, an imaging technique termed spin-echo may be used to overcome dephasing problems. Spin-echo is a pulse sequence comprising a set of RF pulses of defined timing and amplitude, which are usually repeated many times. An MR signal is collected after each repetition. The pulse sequence for spin-echo begins with an initial 90° RF pulse which yields a free induction decay as a function of time. Then at a time TE/2 after the initial pulse, a 180° RF refocusing pulse is applied. After the 180° pulse, a spin-echo signal forms which reaches its maximum amplitude at a time TE after the 90° pulse. A second spin-echo signal can be obtained by applying another 180° refocusing pulse, and further echoes are possible with additional 180° pulses. Using spin-echoes, phase errors from inhomogeneous magnetic fields can be refocused for each data sample.

Some developments have been made for imaging in inhomogeneous fields in which a single data point in K-space is acquired after each refocusing pulse. This method requires that 65,536 refocusing pulses be applied for a 256×256 element image. In clinical applications this pulse sequence would push the patient RF power (SAR) to well beyond acceptable guidelines.

Alternatively, more than one line of K-space can be acquired during a pulse sequence. The technique termed "fast spin-echo" applies one refocusing pulse per line of K-space but multiple lines are acquired following an initial 90° primary excitation. If fast spin-echo is used in a highly inhomogeneous magnetic field, suitable data will be acquired at the center of each K-space line where the center of the spin-echo has refocused the dephased spins. However, the K-space data points extending away from the center of the echo will experience increasing amounts of dephasing from the magnetic inhomogeneity. This results in complete incoherent dephasing of the signal at a distance from the center of the echo and causes blurring and artifacts in the reconstructed image.

A method has been developed for MR imaging in inhomogeneous magnetic fields using spin-echo techniques and the acquisition of many partial line segments in K-space per pulse sequence. The method of the present invention allows shorter imaging times and lower SAR than single data point refocussing methods and higher image quality than fast spin-echo.

SUMMARY OF THE INVENTION

The present invention relates to a method for imaging in inhomogeneous magnetic fields. In a broad aspect of the present invention there is provided, in an MR imaging system having an inhomogeneous magnetic field, a method for acquiring a K-space data set, having coordinates Kx, Ky and Kz, substantially without inhomogeneity induced artifacts, the method comprising:

(a) applying an inhomogeneous magnetic field to a region of interest;

(b) applying an RF excitation pulse to the region of interest to create a spin-state;

(c) subsequently applying a predetermined sequence of RF refocusing pulses to repeatedly refocus the spin-state, allowing a data acquisition from a segment of a K-space line after each RF refocusing pulse, wherein each segment comprises more than one K-space data point and each data point is symmetrically arranged around a center of the refocused spin-state, such that the K-space line is acquired in a predetermined series of segments, wherein a complete set of segments is acquired from a predetermined number of K-space lines after applying the RF excitation pulse; and (d) repeating the initial RF excitation pulse and a corresponding predetermined sequence of RF refocusing pulses while varying the data acquisition along Kx and Ky to obtain a complete two-dimensional K-space data set.

BRIEF DESCRIPTION OF THE DRAWINGS

For a better understanding of the various aspects of the present invention, reference may be made by way of example to the following diagrammatic drawings in which:

FIG. 1A is a graphic representation of a MR pulse sequence used to acquire data in accordance with the present invention.

FIG. 2B is a graphic representation of a K-space trajectory of the pulse sequence of FIG. 1A.

DESCRIPTION OF THE PREFERRED EMBODIMENT

FIG. 1A graphically shows an exemplary embodiment of a method for acquisition of K-space data. The figure has been simplified to show the acquisition of a line of two-dimensional K-space as a series of line segments spanning one dimension of K-space. The pulse sequence comprises an initial RF excitation pulse 10 and a predetermined sequence of RF refocusing pulses 20-20d.

The excitation pulse 10 is applied to create an initial amount of transverse magnetization in a region of interest. This spin-state will decay rapidly due to dephasing caused by the inhomogeneity of the magnetic field. As is known in the art, data is acquired in an inhomogeneous magnetic field by following the initial excitation 10 with an RF refocusing pulse 20 at time TE/2. The RF refocusing pulse 20 acts to move the magnetization into its conjugate position in K-space. This corrects the dephasing of the excited spins and refocuses the transverse magnetization. A refocused echo signal 40 forms, reaching its maximum amplitude at time TE after the initial excitation pulse 10. The RF refocusing pulse can be rapidly repeated 20a-20d to produce further corresponding echo signals 40a-40d.

According to the method of the present invention, each acquired echo signal 40-40d respectively contains data for a readout segment along a line in K-space. The readout segment comprises a predetermined number of K-space data points. A line in K-space containing 256 data points, can be divided into any number of readout segments, each segment containing between 1 and 256 data points. It will be appreciated that each segment must contain more than one data point to offer reduced patient SAR. Less than 256 data points per readout segment are required to avoid the problems associated with increased dephasing when moving away from the center of the refocused spin-echo as is found in the fast spin-echo technique. Preferably, the number of data points will be selected to provide adequate control of inhomogeneity artifact while minimizing RF and gradient switching activity. The number of data points is most preferably an odd number with the number of data points extending out from the center data point being of an order to avoid phase shifts in excess of $\pm \pi/2$. A readout segment containing 5 to 11 data points has been satisfactorily employed in imaging systems.

Five refocusing pulses are shown in the simplified pulse sequence of FIG. 1A. It is to be understood that this is only a portion of the pulse sequence that may be used in the practice of the present invention. In the exemplary embodiment, the RF excitation pulse is selected to be a 90° pulse, while the RF refocusing pulses are 180° pulses. As will be seen in FIG. 1B, this selection of pulse values offers a convenient method for traversing the K-space area, however it is to be understood that the method of the present invention may be carried out using non-90° and non-180° pulses.

An oscillating readout gradient 30-30d has been employed in the exemplary embodiment. The readout (Gx) gradient 30-30d is reversed each time an echo signal 40-40d is acquired. As will be seen in FIG. 1B, the oscillating gradient introduces incremental phase shifts to direct the data acquisition and allow an efficient method of traversing K-space.

In FIG. 1B, the K-space trajectory of the pulse sequence of FIG. 1A is shown. Although only one K-space line is shown in FIG. 1A, the method of the present invention acquires data after each initial excitation from more than one line of K-space with multiple refocusing pulses within each line. In the exemplary embodiment, data is acquired from two conjugate K-space lines after the primary excitation.

Referring to FIG. 1B, the initial RF excitation pulse 10 (shown on FIG. 1A) starts the spin-state at the origin of K-space 100. Phase encoding and prewind gradients, represented by solid arrow 111, move the spin-state to a predetermined starting point in K-space 110. In the exemplary embodiment, the predetermined starting point 110 is at a first end of a K-space line. The first 180° refocusing pulse 20 moves the spin-state through the origin 100 to a conjugate position 112 on a conjugate K-space line. At this point, a readout gradient 30 (shown on FIG. 1A) is applied to direct a data acquisition from a segment 40 of the conjugate K-space line. The segment 40 comprises a predetermined number of K-space data points. The exemplary embodiment as shown in FIG. 1B indicates the segment 40, which covers 1/5 of the span of Kx, contains 51 data points (i.e. 256/5=51). The data points of the segment are symmetrically arranged around the center of the refocused spin-state, indicated at 42. This provides for the acquisition of a small segment of K-space data around a clear refocused signal, reducing the problems of incoherent dephasing. As shown in FIG. 1B, the segment 40 of the conjugate K-space line will be acquired moving in an increasing direction along Kx as directed by the readout gradient. When the acquisition of segment 40 is complete, a 180° refocusing pulse 20a (see also FIG. 1A) moves the spin-state to a conjugate position 113 on the original K-space line. Once again, data is acquired from a readout segment 40a at this point. A reverse readout gradient is applied during this acquisition. The reverse readout gradient directs the data acquisition along Kx in a direction opposite the acquisition direction of segment 40 on the conjugate K-space line. The acquired segment 40a of the first line is as described hereinbefore in regards to the segment 40 of the conjugate K-space line. The segment 40a contains a similar number of data points symmetrically arranged around the center of the refocused echo.

Subsequent refocusing pulses 20b-20d will be applied which reflect the spin-state through the origin of K-space 100 between corresponding conjugate positions along the two K-space lines. At each position a segment 40b-40d of K-space data is acquired in a direction controlled by the oscillating readout gradient. In this way two K-space lines are partially acquired in segments with the acquisition being completed at an end 115 of the conjugate K-space line.

The segments of K-space data not acquired during the first pulse sequence are acquired by a second pulse sequence comprising similar excitation and refocusing pulses as the first pulse sequence described hereinbefore. The predetermined starting position of the second pulse sequence is selected so that the spin-state is positioned to acquire the segments not acquired in the first pulse sequence. Preferably, the predetermined starting point will be selected to allow a uniform direction of acquisition along each K-space line. In the exemplary embodiment, the predetermined starting position is selected as indicated at 112.

In the exemplary embodiment, a two-dimensional K-space data set is acquired by repeating the two pulse sequences as described above for pairs of lines varying along Ky.

The preferred implementation, of the method of the present invention is the acquisition of a three-dimensional K-space data set. A three-dimensional K-space data set is acquired by repeating the two-dimensional acquisition while varying the transverse plane along Kz. The ordering of lines in a three-dimensional acquisition is preferably a spiral scan sequence in the Ky and Kz directions. This method acquires the important central K-space orders while omitting data acquisition in the corners of K-space. In a spiral scan, the central orders of K-space are acquired at the same effective TE times. The use of 180° refocusing pulses as shown in FIGS. 1A and 1B maintains the magnetization in the transverse plane. The 180° refocusing pulses are preferably hard 180° pulses, allowing for shorter echo interval and hence, more segments within the T2 interval.

Care should be taken to avoid phase contamination from stimulated echoes. To minimize stimulated echoes using 180° refocusing pulses, the refocusing pulses should be robust with respect to the magnetic field and the initial excitation pulse. All pulses applied should be very accurate.

It is emphasized that the K-space trajectory of the present invention need not be exactly as shown in FIG. 1B. Non-90° initial excitation pulses may be selected as well as non-180° refocusing pulses. The selection of non-90° and non-180° pulses changes the K-space trajectory. However the central method of the present invention does not change in that, segments of K-space data are collected after each refocusing pulse applied and the data points of each segment are symmetrically arranged around the center of the refocused spin-state. To properly acquire data using non-180° refocusing pulses, the use of gradients may be required to return the spin-state to origin before each non-180° refocusing pulse.

The use of non-180° RF refocusing pulses allows a reduction in applied power. The transverse magnetization is replenished from the stimulated echoes which are stored longitudinally. An additional method for cancelling stimulated echo artifacts involves the use of phase cycled refocusing pulses as disclosed in Graumann et al, Magn. Reson. Med., 3:707, 1986. In this method, phase errors created by indirect and stimulated echoes are cancelled. This method has been shown to be especially effective in $\pi$ pulse echo planar imaging methods as disclosed in Hennel, Magn. Reson. Med., pp116-121, 1992.

Images produced from MR systems having inhomogeneous magnetic fields often contain a ghost artifact. Because the data points which flank the central data point on the spin-echo have increasing spatially varying phase from the magnetic field inhomogeneity, the recorded data will show a periodic phase modulation which differs in sign and amplitude over the imaging volume. The ghosting seen in images produced in inhomogeneous fields is identical to the ghosting from intra-view motion generated phase modulation. However, in the method of the present invention, the phase modulation is completely under the control of the data acquisition scheme and not dependant on motion. Because the phase modulation of K-space is very tightly linked to the K-space trajectory, the ghosts have unique phase patterns determined by the acquisition direction. Considerable reduction of the ghosting pattern is achieved by acquiring two data sets, by the method discussed hereinbefore, in which the corresponding readout segments of the two data sets are acquired in reverse directions in time. Simple averaging of these two data sets results in considerable reductions in ghosting artifact.

In the preferred embodiment, ghost artifact is eliminated by an image post-processing technique for the cancellation of ghosts as disclosed in U.S. application Ser. No. 718,278 filed Jun. 21, 1991, which is incorporated herein by reference. The technique involves the acquisition of three time interleaved K-space data sets and the processing of the data sets to obtain the unghosted image.

The presence of magnetic field inhomogeneities does not allow for the use of slice selective RF pulses. All refocussing pulses employed in the method are non-selective. The data acquisition method of the present invention results in a K-space data set substantially without artifacts. An image is obtained from the data by reconstruction using Fourier transformation. Slight image inconsistencies, caused by the characteristics of the gradients, may occur in the images produced by the method of the present invention. In particular, K-space data points reached during the data acquisition may not be exactly as intended due to the high amplitude and rapid rise times of the gradients. To prevent any inconsistencies, the actual K-space positions of acquired data points will be mapped once for each data acquisition sequence. A regular lattice of K-space will then be interpolated using a Kaiser-Bessel interpolator from the actual measured data set.

We claim:

1. In an MR imaging system having an inhomogeneous magnetic field, a method for acquiring a K-space data set, having coordinates Kx, Ky and Kz, substantially without inhomogeneity induced artifacts, the method comprising:
   (a) applying an inhomogeneous magnetic field to a region of interest;
   (b) applying an RF excitation pulse to the region of interest to create a spin-state;
   (c) subsequently applying a predetermined sequence of RF refocusing pulses to repeatedly refocus the spin-state, allowing a data acquisition from a segment of a K-space line after each RF refocusing pulse, wherein each segment comprises more than one K-space data point and each data point is symmetrically arranged around a center of the refocused spin-state, such that the K-space line is acquired in a predetermined series of segments, wherein a complete set of segments is acquired from a predetermined number of K-space lines after applying the RF excitation pulse; and
   (d) repeating the initial RF excitation pulse and a corresponding predetermined sequence of RF refocusing pulses while varying the data acquisition along Kx and Ky to obtain a complete two-dimensional K-space data set.

2. The method of claim 1 wherein the initial RF excitation pulse is a 90° pulse and the RF refocusing pulses are 180° pulses.

3. The method of claim 1 wherein the initial RF excitation pulse is a non-90° pulse.

4. The method of claims 1 or 3 wherein the RF refocusing pulses are non-180° pulses.

5. The method of claim 4 wherein the spin-state returns to an origin of K-space after each data acquisition.

6. The method of claim 1 wherein the predetermined number of K-space lines is 2.

7. The method of claim 1 wherein each segment comprises between 1 and 256 data points.

8. The method of claim 7 wherein each segment comprises a predetermined number of data points selected to provide adequate control of the inhomogeneity artifacts while using a clinically acceptable amount of RF and gradient switch activity.

9. The method of claim 1 wherein the data acquisition is varied along Kz to obtain a three-dimensional K-space data set.

10. The method of claim 9 wherein the three-dimensional K-space data set is acquired using a spiral scan along Ky and Kz.

11. The method of claim 1 further comprising:
(e) removing the ghost artifact from the K-space data set.

12. The method of claim 11 wherein the ghost artifact is removed by acquiring a duplicate data set in a reverse direction in time and averaging the K-space data set and the duplicate data set.

13. The method of claim 11 wherein the ghost artifact is removed by an image post-processing technique.

14. In an MR imaging system having an inhomogeneous magnetic field, a method for acquiring a K-space data set, having coordinates Kx, Ky and Kz, substantially without artifacts, the method comprising:
(a) applying an inhomogeneous magnetic field to a region of interest;
(b) applying a 90° RF excitation pulse to the region of interest to create a spin-state at an origin of K-space;
(c) moving the spin-state to a predetermined starting position on a first K-space line;
(d) applying a first 180° RF refocusing pulse to move the spin-state through the origin of K-space and to refocus the spin-state at a conjugate position on a conjugate K-space line;
(e) acquiring data from a segment of the conjugate K-space line while applying a first readout gradient to direct the data acquisition along Kx, wherein the segment comprises a plurality of data points such that the segment is symmetrically arranged around a center of the refocused spin-state;
(f) applying a next 180° RF refocusing pulse to move the spin-state through the origin of K-space and to refocus the spin-state at a conjugate position on the first K-space line, wherein a segment is acquired from the first K-space line while applying a second readout gradient opposite the first readout gradient, the segment comprising a plurality of data points such that the segment is symmetrically arranged around the center of a refocused spin-state;
(g) subsequently applying a series of 180° RF refocusing pulses to refocus the spin-state at corresponding conjugate positions along the first K-space line and the conjugate K-space line such that the first K-space line and the conjugate K-space line are partially acquired in segments;
(h) repeating the pulse sequence as in steps (b) to (g), wherein the predetermined starting position is selected to be on the conjugate K-space line to acquire data from segments of the first K-space line and the conjugate K-space line not previously acquired such that a segment of the first K-space line will by acquired after the first 180° RF refocusing pulse; and,
(i) repeating steps (a) to (h) while varying the first K-space line along Ky to acquire a complete two-dimensional K-space data set.

15. The method of claim 14 wherein the plurality of data points is selected to be between 1 and 256.

16. The method of claim 15 wherein the plurality of data points is selected to provide adequate control of the inhomogeneity artifacts while using a clinically acceptable amount of RF and gradient switch activity.

17. The method of claim 14 wherein the first K-space line and the conjugate K-space line are varied along Ky and Kz to obtain a three-dimensional K-space data set.

18. The method of claim 17 wherein the three-dimensional K-space data set is obtained by a spiral scan along Ky and Kz.

19. The method of claim 14 further comprising:
(e) removing a ghost artifact from the K-space data set.

20. The method of claim 19 wherein the ghost artifact is removed by acquiring a duplicate data set in a reverse direction in time and averaging the K-space data set and the duplicate data set.

21. The method of claim 19 wherein the ghost artifact is removed by an image post-processing technique.

* * * * *